United States Patent
Hoenicka et al.

(10) Patent No.: US 9,018,949 B2
(45) Date of Patent: Apr. 28, 2015

(54) SENSOR

(75) Inventors: Reinhold Hoenicka, Ortenburg (DE); Alfons Meilhamer, Rotthalmuenster (DE)

(73) Assignee: MICRO-EPSILON Messtechnik GmbH & Co. KG, Ortenburg (DE)

( * ) Notice: Subject to any disclaimer, the term of this patent is extended or adjusted under 35 U.S.C. 154(b) by 229 days.

(21) Appl. No.: 13/637,265

(22) PCT Filed: Mar. 3, 2011

(86) PCT No.: PCT/DE2011/000224
§ 371 (c)(1),
(2), (4) Date: Sep. 25, 2012

(87) PCT Pub. No.: WO2011/127882
PCT Pub. Date: Oct. 20, 2011

(65) Prior Publication Data
US 2013/0021029 A1  Jan. 24, 2013

(30) Foreign Application Priority Data

Apr. 15, 2010  (DE) .................... 10 2010 015 252
May 20, 2010  (DE) .................... 10 2010 021 118

(51) Int. Cl.
*G01R 33/02*   (2006.01)
*H03K 17/95*   (2006.01)

(52) U.S. Cl.
CPC ...... *H03K 17/9505* (2013.01); *H03K 2217/954* (2013.01)

(58) Field of Classification Search
CPC ....................................................... G01R 33/02
USPC ............................................................ 324/258
See application file for complete search history.

(56) References Cited

U.S. PATENT DOCUMENTS

| | | | |
|---|---|---|---|
| 3,473,110 A | 10/1969 | Hardin et al. | |
| 3,942,045 A | 3/1976 | Palazzetti | |
| 4,402,138 A * | 9/1983 | Glockle et al. | 30/382 |
| 5,801,530 A | 9/1998 | Crosby et al. | |
| 5,814,986 A | 9/1998 | Goskowicz et al. | |
| 7,511,482 B2 * | 3/2009 | Teichmann et al. | 324/207.26 |
| 2004/0155124 A1 * | 8/2004 | Noller et al. | 239/585.1 |

FOREIGN PATENT DOCUMENTS

| | | |
|---|---|---|
| DE | 7438475 U | 7/1975 |
| DE | 3730113 C1 | 3/1989 |
| DE | 8915981 U1 | 11/1992 |

(Continued)

OTHER PUBLICATIONS

International Searching Authority, International Search Report for International Application No. PCT/DE2011/000224, mailed Oct. 31, 2011, 6 pages, European Patent Office, The Netherlands.
International Searching Authority, Written Opinion for International Application No. PCT/DE2011/000224, mailed Oct. 31, 2011, 6 pages, The Netherlands.
International Preliminary Examining Authority, International Preliminary Report on Patentability for International Application No. PCT/DE2011/000224, mailed Oct. 16, 2012, 15 pages, The International Bureau of WIPO, Switzerland.

(Continued)

*Primary Examiner* — Reena Aurora
(74) *Attorney, Agent, or Firm* — Alston & Bird LLP

(57) ABSTRACT

A sensor comprises a housing which defines a measuring side and a connection side, a coil (6) which is arranged in the housing (1) on the measuring side, and a cover (14) for closing the housing on the measuring side. The housing (1) consists of ferromagnetic material, in particular ferromagnetic steel. The coil (6) is positioned and fixed in the housing close to the cover (14) or directly on the cover (14).

21 Claims, 3 Drawing Sheets

(56) References Cited

FOREIGN PATENT DOCUMENTS

| | | | |
|---|---|---|---|
| DE | 29907642 | * | 7/2000 |
| DE | 10341113 A1 | | 5/2004 |

OTHER PUBLICATIONS

German Patent and Trade Mark Office, Office Action for Application No. 102010021118.4, Oct. 22, 2012, 8 pages, Germany.

* cited by examiner

SENSOR

CROSS REFERENCE TO RELATED APPLICATIONS

This application is a national stage application, filed under 35 U.S.C. §371, of International Application No. PCT/DE2011/000224, filed Mar. 3, 2011, and claims priority to the same, which is hereby incorporated by reference in its entirety. This application also claims priority to German Application No. 10 2010 015 252.8, filed Apr. 15, 2010, and German Application No. 10 2010 021 118.4, filed May 20, 2010, both of which are hereby incorporated by reference in their entirety.

BACKGROUND

1. Related Field

The invention relates to a sensor which consists of a housing defined by a measurement side and a connection side, which contains a coil placed on the measurement side of the housing. Therefore it concerns a contactless inductive displacement/distance sensor, like the one described in U.S. Pat. No. 3,473,110 from a long time ago.

2. Description of Related Art

Generic sensors are used these days in different areas with special requirement profiles, for example in aviation, railways, offshore areas, etc. Hermetically sealed inductive sensors are used in particular in aviation. These usually consist of a non-magnetic housing or a housing with very low magnetism, such as those made of stainless steel or titanium. The housing usually contains a core with ferromagnetic properties, for example made from "Permalloy" or from other ferrous sintered materials. The coil body is placed along with the core inside the housing. The measurement side of the sensor housing is typically finished with a lower material thickness. The connection side can be sealed with a glass-to-metal gasket, where typically a closing coupling, socket or plug is provided.

The sensor coil of the sensor described on U.S. Pat. No. 3,473,110 is embedded in a hard or ferrite pot core. This has a central cone, a floor and a thin external wall, which create a rotation-symmetrical opening in the form of a circular-shaped groove in the core, in which the coil is inserted. The hard pot core consists of sintered ferrite or soft magnetic steel, such as Permalloy. The housing consists of a non-ferromagnetic material in which the coil and the core are inserted. Stainless steel housings are typically used in the fields of aviation or hazardous industrial atmospheres. The housing has a locking cap which is either soldered or welded to the measurement side of the housing. The measurement side may also be closed, while the connection side may have a hole for inserting the coil and the core. Either an integrated cable, a plug, or a coupling/socket are intended for the electrical connection.

The sensor described on U.S. Pat. No. 3,473,110 is problematic in many ways. Thus it is extremely difficult to create a permanent seal between the cable and the housing. The sealing required between the grout and the housing in order to achieve a hermetic seal is hard to accomplish. This is caused by common conditions such as high temperature, temperature variations, aggressive media, high or low pressure, alternating pressure, etc. In particular, a high number of pressure or temperature changes, like the ones which arise on airplanes, are the ones which may cause leaks and/or a deficient seal.

There are also sensors with integrated connectors instead of built-in plugs/sockets, instead of integrated cables. Waterproof plugs are extremely costly and expensive to produce. If the measurement side of the sensor housing is sealed, it has shifted the problem of achieving an adequate seal to the connection side. Waterproof plug connectors have the disadvantage that they are expensive. An integrated plug and/or a corresponding coupling/socket also requires a significant space, which results in an increased sensor size. This applies especially as the mating plug increases even more the required installation space of the sensor. In comparison with a simple connection over a built-in cable, the required space can almost triple.

In the known sensor, it is also very expensive to drill or mill the sensor housing from the connection side, especially since the wall thickness on the measurement page should be very thin in order to affect the electromagnetic fields as little as possible.

Finally, significant costs arise as a result of the required core: namely, on the one hand, the cost of the core, and, on the other, costs caused by the assembly with the core. Cores made from Permalloy or similar "magnetically soft" metals must be machined, making them costly and expensive. Furthermore, they must be inserted in the housing through complex operations: for example, a spring element placed on the connection side presses them against the measurement side, in order to bring the core and the coil to a defined and temperature-stable fixed position towards the front and/or the measurement side of the housing.

BRIEF SUMMARY

Considering the problems described above, the objective of the present invention is to eliminate these problems as much as possible, in particular those relating to the core.

The previous objective is achieved via a sensor with the technical features described in the accompanying claims. The invention relates to a sensor which has a housing defined by a measurement side and a connection side, which contains a coil placed on the measurement side of the housing. The measurement side of the sensor's housing is closed, for example, via a cover. It should be noted that the term "cover" must be understood in the broadest sense at this point. This can also consist of a housing with a closed measuring side (front side) with a thin wall. In any case, the cover serves for closing the measurement side of the housing, regardless of whether it is an integral component of the housing or an additional component.

In the case of this invention, is very important that the housing is made from a ferromagnetic material, in particular a ferromagnetic steel. The steel can be, in particular, a ferromagnetic stainless steel from one of many different types. The coil is positioned near the cover or directly on the cover in the housing and properly attached.

According to the invention, it has been recognized that under the current state of the art the expense of a separate core is not required if the housing is made from a ferromagnetic material, for example with medium or high relative permeability. Commercial ferromagnetic steels have, for example, a relative permeability in the range of approximately equal to 1200-1500 μr. By doing this, the housing works like a core and serves for field guidance and for increasing the inductance. The cover is made from a non-ferromagnetic material, which closes the measurement side of the housing.

In any case, according to the invention it is not required to achieve a very good inductive effect by using a discrete core. Instead, the housing works in a very refined way in the sense of a traditional core, namely due to the special characteristics of the specific material of the housing and its design in the form of a pot core. In an embodiment of the invention, the contour of the housing is thus made from known pot core shapes. The central cone has an effect over the field gain and guidance of the electromagnetic fields generated by the coil similar to the one produced by the known pot cores. This allows eliminating the discrete core, resulting in enormous savings due to the absence of the core and a simpler assembly.

In an exemplary embodiment, the material of the housing has a medium to high relative permeability, namely for field guidance and to increase inductance.

In a further exemplary embodiment, the coil used is an air coil which can be inserted into an opening machined in the ferromagnetic housing. In a particularly exemplary embodiment, an integral cone with a coaxial design is placed inside the housing and is used for inserting and positioning the coil in the context of a coil core. The inside of the housing has a pot-like shape, as it is known from the application of ferrite or pot cores. Since the core is void—per se—this results in cost advantages over the conventional design. The installation of the sensor is also significantly simplified, resulting in a further cost advantage.

The cone formed inside the housing has the shape of a concentric cylinder. During production the coil will be attached on or embedded in this cylinder, whereby further means bring the benefit that they hold and/or position the coil near the measurement side. Further measures in this regard will be explained later.

In a further preferred embodiment the inside of the housing is divided into a bottom section in the coil area of the measurement side, and a connection section in the connection side. Provided that these two areas are separated and/or hermetically sealed from each other, it will only be necessary to seal the measurement side of the housing by means of a hermetic seal. Other sealing measures are unnecessary, especially since the connection section complies with the requirements without a further seal.

Regarding the coil connection, it brings a further benefit when said coil connection has two or more substantially rigid connection contacts, which are, for example, in the form of soldered pins or contact tubes. The contact pins and/or contact tubes extend through passages at the bottom section, namely from the sensor area through the bottom section into the connection area. The connection contacts are electrically isolated relative to the housing.

Insulating feedthroughs, for example made from ceramics or glass, may be used for the electrical insulation of the contact pins/contact tubes. These insulated feedthroughs are inserted and/or pressed, glued or soldered into the passages. Any feasible sealing measures are possible. In any case, it is essential that the contact pins/contact tubes are led through the insulating passthroughs so that any electrical contact between the contact pins/contact tubes and the housing is effectively prevented.

It is also possible to use the sealing glazing to insulate the passthroughs and the coil area towards the connection section. Such glazing can be generated in a vacuum atmosphere, whereby the contact pins/contact tubes inserted through the main passages of the bottom section are sprayed with glass. This is required to ensure a good adhesion between the glass and the metal surface on the one hand, and on the other between the glass and the surface of the contact pins/contact tubes, namely by considering the lowest possible interfacial energy. For example, in the concrete case of the so-called vacuum glazing, this type of glazing creates an adequate seal between both sections—the coil section and the connection section—considering that there is an inner passage when contact tubes are used. This can be simply connected over the connection side—that is, from the connection section—by welding passing connection cables, for example, in the form of stranded wires, to the contact tubes, where due to the capillary effect the liquid solder penetrates into the tubes and also ensures a hermetic seal between the two sections. A crimp connection of the passing connection cable with the contact pins is also feasible.

Covering the connection side of the housing has a very special significance in the context of a hermetic encapsulation of the sensor element. This cover is made of a non-ferromagnetic material; for example, it can be a metallic or ceramic plate attached to the milled section at the front side of the housing. It is also possible that a cap can be used for covering, where the measurement side of the sensor housing is at least slightly snug or overlapped.

On a hermetic seal it is particularly beneficial when the cover is firmly bonded to the measurement side end of the housing—either by welding, gluing, soldering or otherwise fastening. An interference fit with an embedded seal is also conceivable.

If an electrical insulator is inserted between the cover and the coil, wherein this insulator can be a very thin insulating plate or an insulating film, a better electrical insulation may be achieved. An appropriate coil insulation can be achieved by means of discs, foils or other non-conducting materials placed on the bottom or on the sides of the external wall of the sensor. It is also possible to make the coil body from any materials which can be conveniently processed.

As previously mentioned, it is beneficial if a pressure device is placed between the coil and the bottom of the housing, which constantly presses the coil against the measurement side—specifically against the cover and/or the electrical insulation between them. For this purpose, a special elastic or spring-loaded pressure device can be placed between the coil and the housing bottom, for example, in the form of an elastomer ring which can be fixed permanently in the arrangement.

Also, it is conceivable that the connecting cable inside the housing, namely in the connection section, is soldered or crimped to the electrical connections of the coil. Such a simple design renders the use of connector plugs, connector sockets/couplings unnecessary, thus reducing significantly the length and weight of the sensor. The elimination of such plug connectors, plug sockets, etc., alone reduces weight by half, in comparison with a conventional sensor with appropriate connection means. A hermetically sealed sensor with an integrated cable can be built very easily and inexpensively thanks to the hermetic sealing of the coil arrangement at the measurement side. However, it is possible to place a connector socket or connector plug in the connection side of the housing, wherein the connector socket or the plug is welded or glued to the housing. Ultimately the socket or plug can be treated as a component integrated into the housing.

In summary, it is worth noting that the sensor according to the invention provides a hermetic encapsulation of the sensor element, which makes the sensor especially suitable for the aerospace industry.

The front side cover provides in particular a hermetic seal by material closing, optionally through welding, at least if at the same time the coil wires and/or contact pins or contact tubes are sealed by glazing.

All of this results in manufacturing cost advantages, not least due to the fact that a discrete core is not required. Conventional connectors are no longer necessary, since they are not required. In any case, all preceding observations result in a much more compact design in comparison with the current state of the art—in particular a shorter construction. This also brings a considerable weight reduction, especially when connectors can be spared.

Another major advantage of the invention results from the compact arrangement and the glass encapsulation, wherein a vibration-proof design is feasible because the vibration-enabled masses according to the embodiment claimed here are much smaller than those in the current state of the art.

Longer durability and/or service life are also achieved since fewer components are required, thus reducing—per se—the probability of fault. Also, the coil element can be installed from the measurement side before attaching the cover, which results in better accessibility. In comparison with conventional sensors, this construction is installation-friendly for the manufacturer.

Finally, a larger detection range (measurement area/switching distance) can be achieved by providing a separate cover in the form of a very thin plate, namely because of the thin design of the cover. On top of that, a higher copper fill factor is possible as in designs with a discrete core.

BRIEF DESCRIPTION OF THE FIGURES

There are multiple ways to implement and develop the findings of the present invention in an advantageous way. This is indicated on the one hand in the accompanying subordinate claims, and on the other in the subsequent explanation of the examples of various embodiments of the invention illustrated in the drawings. Also, exemplary implementations and developments of the findings are explained in connection with the explanations of the examples of various embodiments of the invention illustrated in the drawing. In the drawings.

DETAILED DESCRIPTION OF THE VARIOUS EMBODIMENTS

Figure 1:
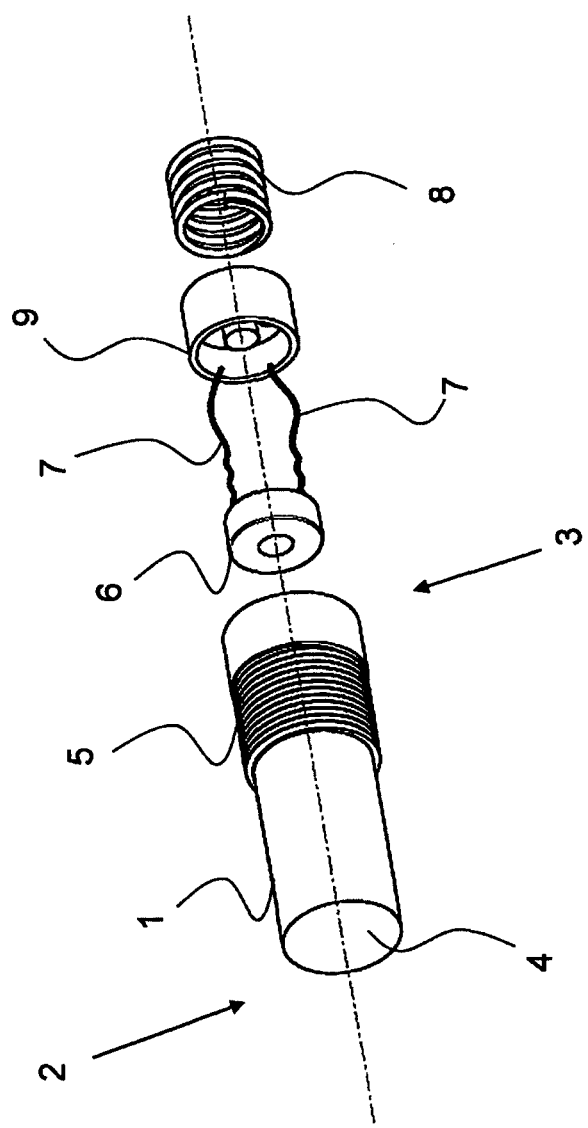
FIG. 1 shows the essential elements of a sensor known from the state of the art in a schematic exploded view.

For a better understanding of the findings of the invention, please refer to FIG. 1 for a known sensor as described for example in U.S. Pat. No. 3,473,110. The sensor consists of a housing 1, which defines a measurement side 2 and a connection side 3. The housing 1 is made from stainless steel and includes a single-piece, measuring-side housing part 4 made from stainless steel. Providing a particular cover on measurement side 2 is not necessary.

FIG. 1 also shows that if the housing 1 is fitted with a male thread 5, this allows screwing and/or mounting a holder, unit, device or similar attachment to the housing 1.

Regarding the measurement-side housing part 4, it should be noted that the wall thickness should be as even and thin as possible in order to prevent an attenuation of the sensor by eddy currents. Making a front-side, thin wall is costly and critical to the manufacturing technology.

Based on FIG. 1, the assembly of the well-known sensor can be reproduced, according to which the coil 6 installed in the housing 1 is provided in a wrapped form and is equipped with connection wires 7 from the back, i.e., from the connection side 3. The coil 6 is pressed against the measurement side of the housing part 4—i.e., to the measurement side 2—by means of a spring 8. The spring 8 is used to impinge the coil 6 with a defined force, in order to press it against the measurement-side housing part 4. This is to ensure that whenever the temperature changes, the position of the coil 6 relative to the measurement-side housing part 4 or to the front surface of the housing 1 remains intact and does not change due to thermal variations.

It is worth noting that in the known sensor the coil 6 is inserted in a pot core 9, requiring a non-trivial amount of assembly work.

Figure 2:
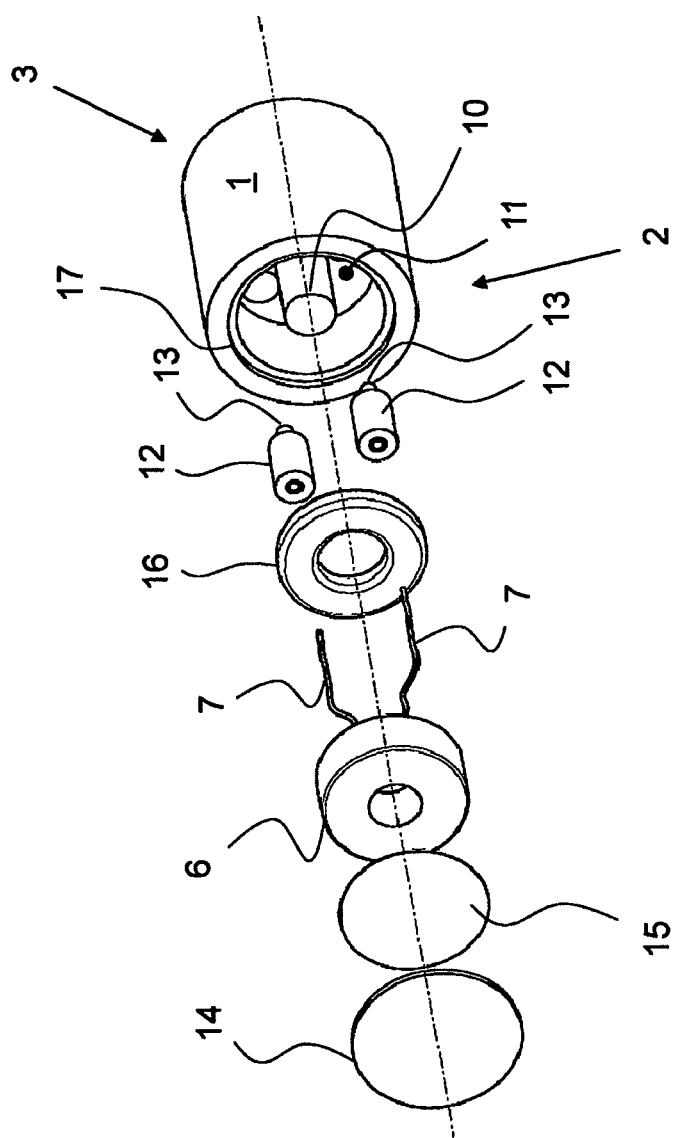
FIG. 2 shows an initial example of the embodiment of a sensor according to the invention in a schematic exploded view.

FIG. 2 shows an initial embodiment example of a sensor according to the invention, wherein the housing 1 is made from ferromagnetic stainless steel. The housing 1 also has the required external contour, whereas for simplification purposes the representation of a mounting thread, a mounting flange or similar has been omitted.

FIG. 2 clearly shows from the open measurement side 2 that the contour of a pot core, in which the coil 6 is inserted, is incorporated into the housing 1. More specifically, it is shown as a concentric cylinder cone 19 which interacts with the other parts of the housing in the context of a pot core and forms a sort of holder 10 located in housing 1.

The coil 6 is provided with connecting wires 7, which are intended to connect over the insulated passthroughs 12 located in a bottom section 11 of housing 1. The insulated feedthroughs 12 at the end are equipped with contact pins 13, namely to connect the connection side to a secondary connection line.

According to the requirements, an insulating film 15 should be placed between the coil 6 and cover 14 for closing the housing 1. A elastomer ring 16 is used to apply force over the coil 6, pressing it against the cover 14 and against the inside of the housing 1.

The front-side cover 14 can be placed in the measurement side of the housing 1, namely in a specific passage 17. Then the cover 14 is welded or glued to the housing 1.

Coil connections 7 of the coil 6 are soldered to the contact pins, where the contact pins 13 sit in the insulating sleeves 12. The insulating sleeves 12 can be made from glass or ceramic, where glass is particularly suitable for the production of seals, according to which the contact pins 13 are connected to the housing 1 over a glazing process. Such a connection is hermetically sealed. The coil 6 is hermetically encapsulated when the front-side cover 14 is welded to the housing, whereby the sensor is permanently protected against the most adverse environmental conditions or atmospheres.

Figure 3:
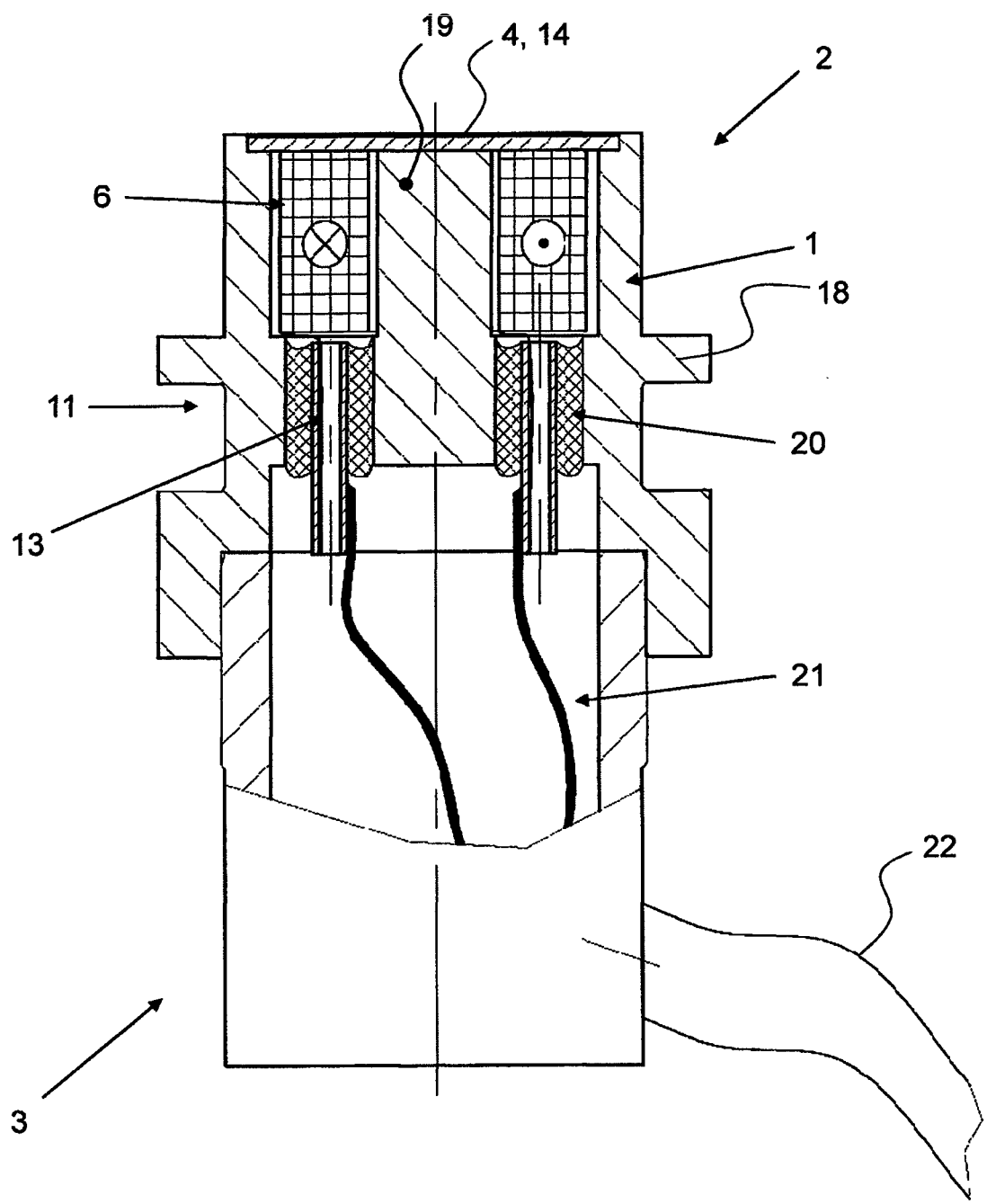
FIG. 3 shows a second example of the embodiment of a sensor according to the invention in a partially-cut schematic side view.

FIG. 3 shows a second embodiment example of a sensor according to the invention, shown in the complete or assembled status in comparison to FIGS. 1 and 2.

The housing 1 is equipped with a mounting flange 18, which can also be readily provided with a mounting thread on the outside of the housing.

The coil 6 borders directly on the cover 14, which is made from a non-ferromagnetic material—for example, as a metallic plate.

The housing 1 itself is made from a ferromagnetic steel with high permeability.

The inside of the housing 1 is shaped as a coil pot, where a molded cone 19 serves for centering the coil 6.

Two electric contact tubes 13 are electrically insulated in the bottom section 11 of the housing 1. For purposes of insulation and hermetic sealing, the contact tubes 13 are coated with glass, whereby two glass insulation bodies 20 resulted that serve as electrical insulators and as hermetical seals. The connection wires 7 of the coil 6 are led to the connection section within the contact tubes 13 and soldered there with the contact tubes 13.

In the end, the contact tubes 13 are soldered with a secondary connection wire 21. The molten solder penetrates the contact tubes 13, also creating a hermetic seal.

FIG. 3 shows an embodiment example where the connection cable 22 is connected directly to the contact tubes 13 over the connection wires 21, so that the use of additional connectors is no longer required. Accordingly, the sensor according to the invention has a very short length.

For additional features which are not shown in the figures mentioned above, please refer to the general part of the description in order to avoid repetitions.

Finally, it must be noted that the embodiment examples mentioned above are not exhaustive and are used exclusively to illustrate the findings of this invention—that is, there are many additional embodiment examples of this invention.

LIST OF REFERENCE CHARACTERS

1 Housing
2 Measurement side (of the housing)
3 Connection side (of the housing)
4 Measurement-side housing part
5 Male thread (of the housing)
6 Coil
7 Connecting wires
8 Spring
9 Pot core
10 Seat
11 Bottom section (on the inside of the housing)
12 Insulating sleeves
13 Contact pin, contact tubes
14 Cover (in/on the front side of the housing)
15 Insulating film
16 Elastomer ring
17 Recess (in the front side of the housing)
18 Mounting flange
19 Cone, cylinder (inside the housing)
20 Glass insulation body
21 Connecting wire
22 Connecting cable

The invention claimed is:

1. Sensor comprising:
   a housing (1) that defines a measurement side and a connection side;
   a coil (6) placed in the measurement side of the housing (1); and
   a cover (14) that closes the measurement side of the housing (1),
   wherein:
      the housing (1) is made from a ferromagnetic material;
      the coil (6) is positioned and fixed close to the cover (14) of the housing;
      the coil (6) is arranged in a seat (10);
      the seat (10) is inside and an integral part of the housing (1);
      the seat (10) comprises an integral concentric cylinder (19) having a coaxial shape and being used to position the coil (6); and
      the concentric cylinder (19) is shaped as an integrated pot core in relation to a bottom and an outside of the housing (1).

2. Sensor according to claim 1, wherein the ferromagnetic material is a ferromagnetic steel.

3. Sensor according to claim 1, wherein the coil (6) is positioned and fixed directly on the cover (14) of the housing.

4. Sensor according to claim 1, wherein the material of the housing (1) has a medium to high relative permeability.

5. Sensor according to claim 1, wherein the inside of the housing (1) is divided into a bottom section (11), a measurement-side coil section, and a connection-side connection section.

6. Sensor according to claim 5, wherein the coil includes two substantially rigid connection contacts, in the form of soldered pins or contact tubes (13), which extend through openings in the bottom section (11) into the wiring area, wherein the connection contacts are electrically insulated relative to the housing (1).

7. Sensor according to claim 6, wherein:
   at least one insulation sleeve (12) is provided for insulation purposes; and
   the soldered pins or contact tubes (13) sit in the at least one insulating sleeve (12).

8. Sensor according to claim 7, wherein the at least one insulation sleeve is made from at least one of ceramic or glass.

9. Sensor according to claim 7, wherein the at least one insulation sleeve is at least one of plugged, pressed, glued, or soldered to one or more passages.

10. Sensor according to claim 9, wherein a glass sealing is used to insulate the passages and the coil area in relation to the connection section.

11. Sensor according to claim 6, wherein the coil (6) is connected to the connection contacts (13) over connecting wires (7), which are at least one of soldered or crimped to the connection contacts (13).

12. Sensor according to claim 1, wherein the cover (14) is not ferromagnetic.

13. Sensor according to claim 12, wherein the cover (14) is a metallic plate.

14. Sensor according to claim 12, wherein the cover (14) is a ceramic plate.

15. Sensor according to claim 12, wherein the cover (14) seats in the measurement side of the housing (1), forming a material bond.

16. Sensor according to claim 12, wherein the cover (14) is at least one of glued, welded, or soldered to the housing (1).

17. Sensor according to claim 1, wherein an electrical insulator is placed between the cover (14) and the coil (6).

18. Sensor according to claim 17, wherein the electrical insulator is a double plate.

19. Sensor according to claim 17, wherein the electrical insulator is an insulating film (15).

20. Sensor according to claim 1, wherein a pressure device is placed between the coil (6) and the bottom section of the housing.

21. Sensor according to claim 20, wherein the pressure device is an elastomer ring (16), which constantly presses the coil (6) against the cover (14).

* * * * *